US012237026B1

(12) United States Patent
Srivastava et al.

(10) Patent No.: US 12,237,026 B1
(45) Date of Patent: Feb. 25, 2025

(54) SYSTEMS AND METHODS FOR A COMPRESSED BITCELL READ-ONLY MEMORY

(71) Applicant: Advanced Micro Devices, Inc., Santa Clara, CA (US)

(72) Inventors: Vaibhav Anand Srivastava, Bengaluru (IN); Pankaj Kumar, Bengaluru (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 155 days.

(21) Appl. No.: 17/982,382

(22) Filed: Nov. 7, 2022

(51) Int. Cl.
| G11C 17/00 | (2006.01) |
| G11C 17/12 | (2006.01) |
| G11C 17/14 | (2006.01) |
| G11C 17/16 | (2006.01) |

(52) U.S. Cl.
CPC .............. *G11C 17/12* (2013.01); *G11C 17/14* (2013.01); *G11C 17/16* (2013.01)

(58) Field of Classification Search
CPC .......... G11C 17/12; G11C 17/14; G11C 17/16
See application file for complete search history.

(56) References Cited

U.S. PATENT DOCUMENTS

| 5,787,033 | A | * | 7/1998 | Maeno | ................... | H10B 20/00 |
| | | | | | | 365/182 |
| 6,538,943 | B2 | * | 3/2003 | Rogenmoser | ............ | G11C 7/12 |
| | | | | | | 365/230.03 |
| 2007/0268042 | A1 | * | 11/2007 | Paul | ................. | H03K 19/17704 |
| | | | | | | 326/44 |
| 2010/0244892 | A1 | * | 9/2010 | Paul | ................... | H03K 19/1776 |
| | | | | | | 365/94 |
| 2016/0378898 | A1 | * | 12/2016 | Srivastava | ............ | G06F 30/398 |
| | | | | | | 716/133 |
| 2017/0084316 | A1 | * | 3/2017 | Kulkarni | .................. | G11C 7/12 |

* cited by examiner

*Primary Examiner* — Mushfique Siddique
(74) *Attorney, Agent, or Firm* — Greenberg Traurig, LLP

(57) ABSTRACT

The disclosed computer-implemented method relating to read-only memory can include (i) asserting a column select signal to select a particular column within a column mux read-only memory, (ii) forwarding, in response to asserting the column select signal, a bit value stored at that particular column to a gate of a transistor that connects a first stage local bitline to a second stage local bitline, and (iii) forwarding an inversion of the bit value to the second stage local bitline through the drain of the transistor for local bitline sensing. Various other methods, systems, and computer-readable media are also disclosed.

20 Claims, 12 Drawing Sheets

SYSTEMS AND METHODS FOR A COMPRESSED BITCELL READ-ONLY MEMORY

BACKGROUND

Modern computing systems can store executable instructions, such as BIOS instructions, to facilitate the booting up process, for example. In some examples, these instructions can be stored within read-only memory. With the emphasis on technology miniaturization, a primary goal is to reduce a design footprint in order to build denser chips. However, increasing miniaturization does not necessarily guarantee a proportional area reduction due to additional layout mandates to maintain a corresponding yield. There is a desire to restructure macros such that the resultant macros are denser and have equal or lower power (both dynamic and static) consumption.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
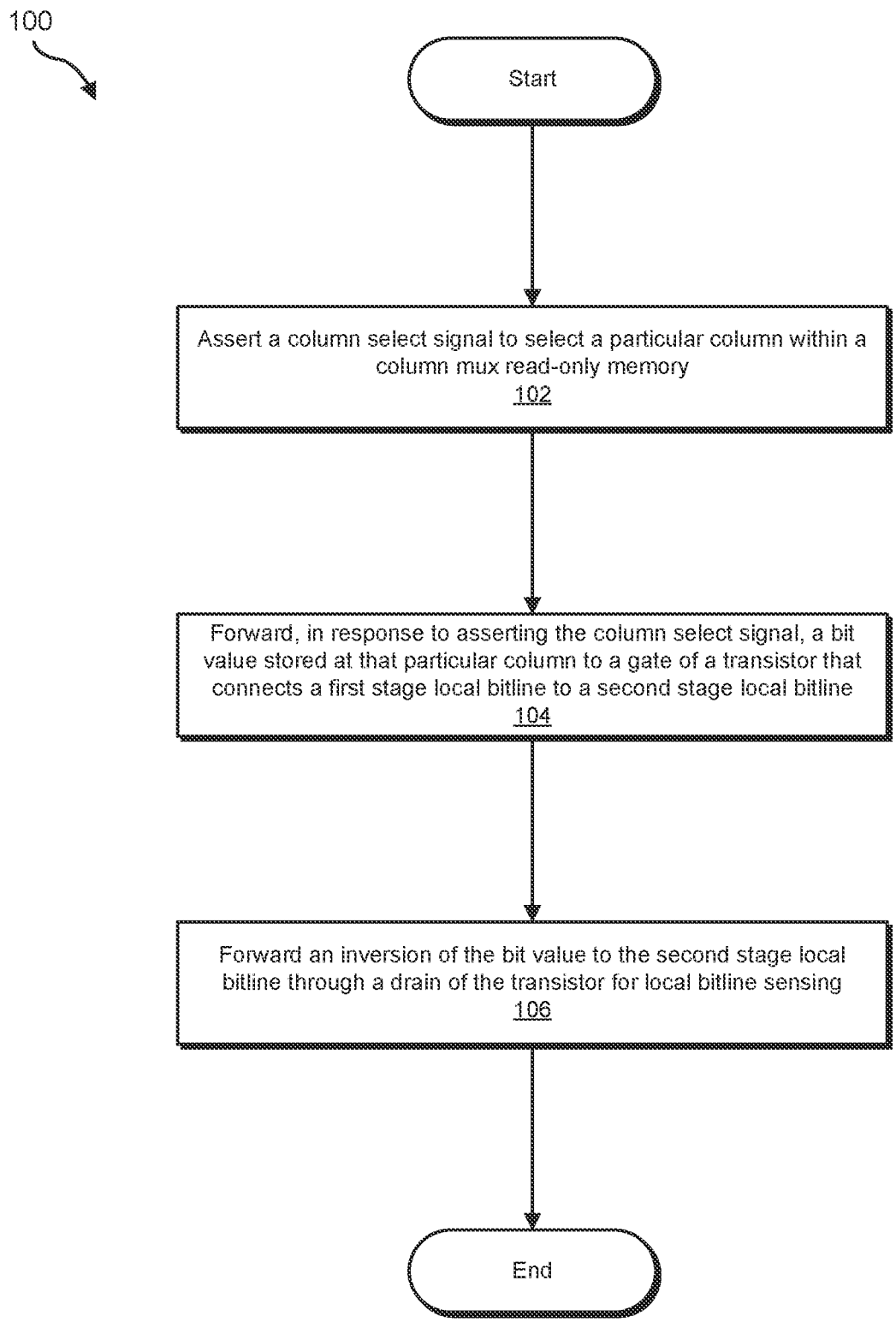
FIG. 1 is a flow diagram for a method relating to read-only memory.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE EMBODIMENTS

The present disclosure is generally directed to systems and methods relating to read-only memory. An example method can include (i) asserting a column select signal to select a particular column within a column mux read-only memory, (ii) forwarding, in response to asserting the column select signal, a bit value stored at that particular column to a gate of a transistor that connects a first stage local bitline to a second stage local bitline, and (iii) forwarding an inversion of the bit value to the second stage local bitline through a drain of the transistor for local bitline sensing.

In some examples, the mux read-only memory stores instructions for an instance of the Basic Input/Output System.

In some examples, the transistor comprises a P-channel metal-oxide-semiconductor transistor.

In some examples, the bit value is stored in a transistor bitcell.

In some examples, the column mux read-only memory comprises a sub-bank.

In further examples, a local evaluation section is disposed between two instances of the sub-bank.

In some examples, the first stage local bitline and the second stage local bitline are substantially decoupled.

In some examples, the first stage local bitline stores a one by connecting a drain of a second transistor to a source of the second transistor.

In some examples, the first stage local bitline stores a zero by connecting a drain of a second transistor to the column select signal.

In some examples, a single bitcell effectively stores two separate values.

A corresponding column mux read-only memory can include a column select signal line to select a particular column within the column mux read-only memory, a first stage local bitline that stores a bit value at a particular column and that is connected to a gate of a transistor, and a second stage local bitline that is connected to a drain of the transistor and that forwards an inversion of the bit value.

Another example method can include (i) connecting a column select signal line to a first stage local bitline in order to select a particular column within a column mux read-only memory, (ii) connecting the first stage local bitline to a gate of a transistor, and (iii) connecting a second stage local bitline to a drain of the transistor such that the drain of the transistor is configured to forward an inversion of a bit value stored in the column mux read-only memory.

FIG. 1 shows an example flow diagram 100 for a corresponding method relating to read-only memory. At step 102, one or more of the systems described herein can assert a column select signal to select a particular column within a column mux read-only memory. As used herein, the term "column mux read-only memory" generally refers to read-only memory having a column multiplexer configuration, consistent with the discussion of FIGS. 2-12 below. Similarly, as used herein, the term "column select signal" generally refers to a signal that enables the selecting of a column or bitcell within read-only memory, as discussed further below.

Figure 2:
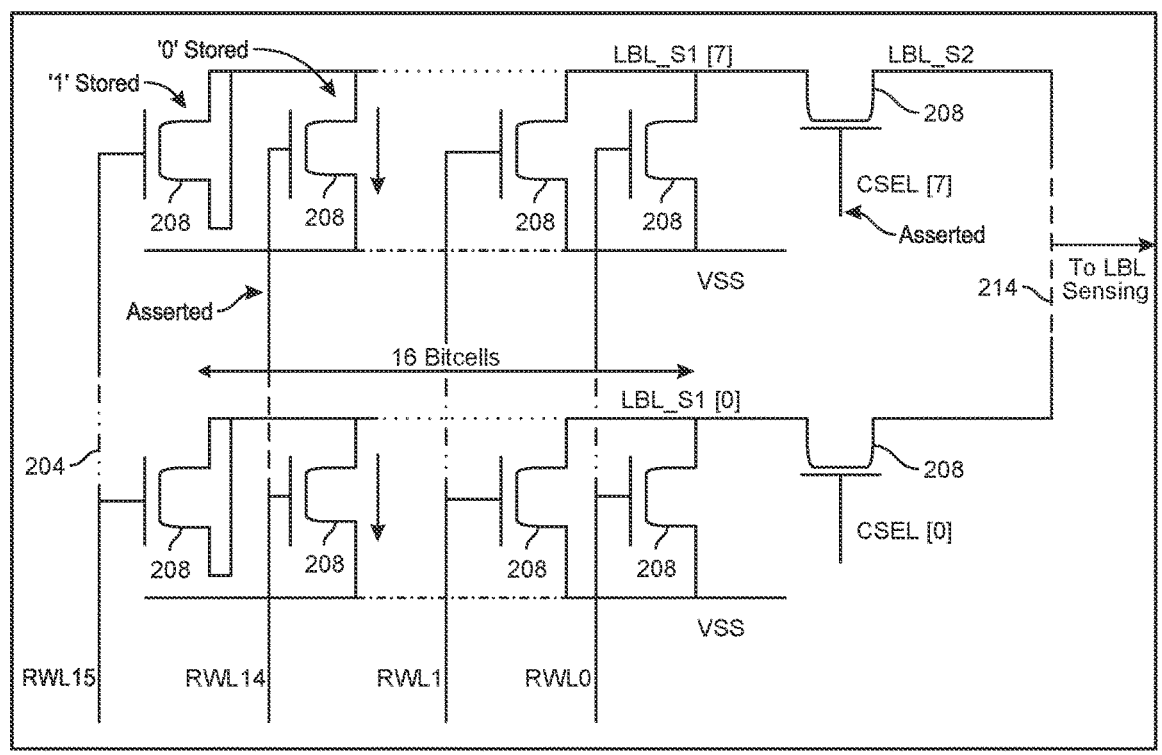
FIG. 2 is a diagram of an example read-only memory.

FIG. 2 shows an example design 200 according to a related methodology. As further shown in this figure, design 200 can include multiple instances of transistor 208, which can correspond to bitcells. As used herein, the term "bitcell" generally refers to an electronics unit (e.g., a transistor) for storing a bit value. Design 200 can further include an input portion 204 and an output portion 214.

With the emphasis on technology miniaturization, a primary goal is to reduce a design footprint in order to build denser chips. However, increasing miniaturization does not necessarily guarantee a proportional area reduction due to additional layout mandates to maintain a corresponding yield. There is a desire to restructure macros such that the resultant macros are denser and have equal or lower power (both dynamic and static) consumption. This application discloses a solution for footprint reduction for memory (e.g., ROM) macros having a mux architecture by employing a unique column mux select technique and featuring data compression along a read-wordline (RWL) (i.e., storing more than one bit of information in a single bitcell). The resultant architecture not only reduces the macro area significantly but also exhibits lower dynamic power and leakage values for a bitcell array. The solution also exhibits a small penalty in bitcell discharge time but also enables stage reduction during a bitline sensing phase. This leads to a gain in over-all access time as well.

Read-only-memory serves as an efficient permanent storage medium for instruction codes used in core boot-up and processing. An area efficient, fast, and low power group of read-only memories directly determine performance and efficiency values of the whole chip. In some examples, in core design a NOR-type read-only memory is preferred for its fast random access but is not area efficient. Hence, area reduction techniques are helpful to combine both area and performance.

A single transistor (in this case, an NMOS) can serve as a bitcell in read-only memory to store one bit of information. A '0' can indicate that a source of the device is shorted to ground supply (VSS) and a '1' can indicate that the source is shorted to the local-bitline (LBL). The memory access-time is defined by a read '0' operation.

A bitcell can be a minimum size device (i.e., to make a denser array) making its discharge current very sensitive to an input (read wordline or RWL) slope and output (LBL) load. A mux-ed and a bank architecture can be implemented to reduce the load on both signals and to improve access time. CSEL signals can serve as select lines for a mux.

Figure 3:
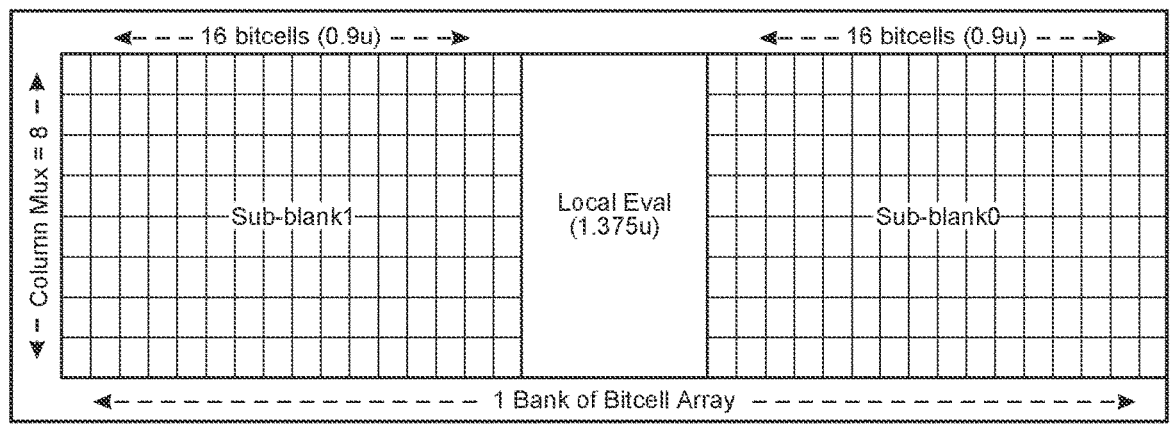
FIG. 3 is a diagram of example sub-banks.

By way of illustrative example, a core chip can utilize 20 ROMs where each has a 2.5K capacity. In these examples, each word can be 32 bits long. The design can feature a column mux with eight options which brings a number of RWLs to 320. The corresponding bitcell array can be divided into 10 banks with 5 banks on either side of a control block. To further reduce load on a corresponding local bitline, each bank can be further divided into 2 sub-banks with the bitline sensing block placed in between. This can result in a number of RWLs per bank=32 and per sub-bank=16. Accordingly, in this example, one bank of one bit-slice can be made up of two 8×16 bitcell arrays (sub-banks) with one local bitline sensing block in the middle (which can be referred to as a local evaluation section). FIG. 3 shows an illustrative example of the two 8×16 bitcell arrays and the local evaluation section in the middle.

This application generally discloses a design that features benefits in terms of timing, leakage, and dynamic power. As one illustrative example, an 8×32 bank can contribute 52% to a total macro area. Even a small area savings in an array block can lead to a significant gain in overall macro area due to the block's iterative nature.

Regarding timing, access time in general and bitcell discharge time specifically will not depreciate significantly. Also, during the read '1' operation the LBL in the float state can remain within 5% margin of its pre-charged state (VDD or VSS). Regarding leakage, bitcell leakage can contribute around 70% to total macro leakage. So, any increment in bitcell leakage will culminate into significantly higher macro leakage. Regarding dynamic power, like leakage, active power should also be at parity or lower than in related designs.

Figure 4:
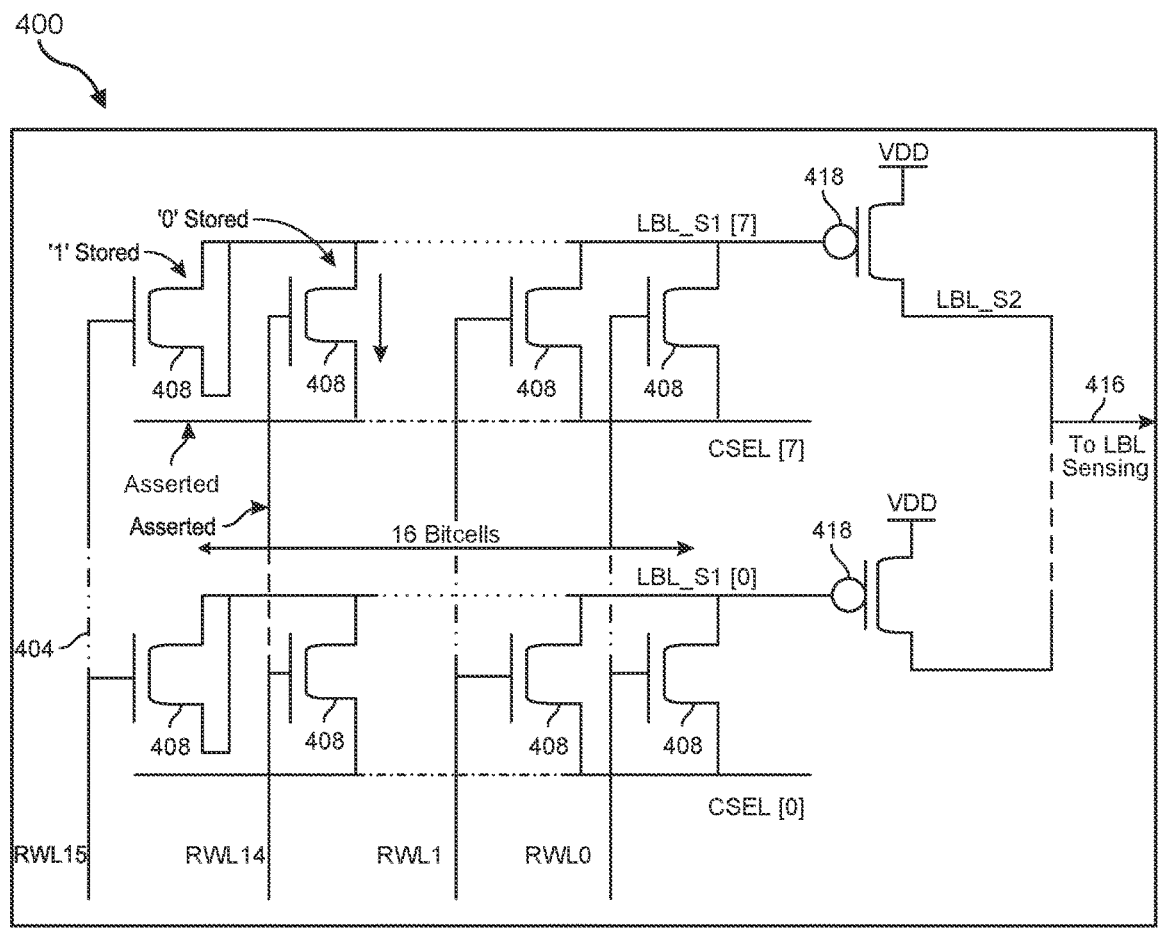
FIG. 4 is a diagram of example read-only memory.

This application combines two concepts to improve along the timing, leakage, and dynamic power dimensions that are outlined above. An example of the first concept is shown in FIG. 4 and improves upon the design of FIG. 2. As shown in FIG. 4, and similar to FIG. 2, a design 400 can include an input portion 404 and an output portion 416. Instances of a transistor 408 can form bitcells as part of the read-only memory.

Design 400 effectively replaces a ground supply rail (VSS) running across the 16 bitcells in one column by the corresponding column-select signal (CSEL) (compare FIG. 2 and FIG. 4). All the bitcells in a given column can have their source terminals shorted to the CSEL signal in case these bitcells hold a '0'. For bitcells holding a '1' both drain and source terminals can still be connected to LBL, as in the related design.

In design 400, the polarity of CSEL[7:0] signals can also be reversed. In other words, the configuration can be changed from one-hot bus (only one out of eight CSEL signals will go high, and others will remain at VSS) to one-cold bus (only one out eight will go low, and others will remain at VDD). The corresponding column-select gate (e.g., an NMOS with CSEL tapped at its gate) in the related design (see FIG. 2) which is used to connect the level-1 bitline (LBL_S1) to the mux-out level-2 bitline (LBL_S2) when selected, can also be replaced by a PMOS of approximately the same drive strength but in a different orientation. The different orientation can reflect the fact that the same CSEL signal cannot be used to tap at the column-select gate due to the reversed polarity. Also, replacing the column-select gate NMOS with a PMOS while keeping the same connections might create inefficiencies or competitions because still a '0' (low voltage level) should be sensed from the level-1 bitline (LBL_S1) and make the level-2 bitline (LBL_S2) toggle if it is a read '0' operation. Lastly, the change described above effectively decouples LBL_S1 from LBL_S2 while discharging. In the related design of FIG. 2, the bitcell discharge might be slow due to significant charge sharing between the two nodes. Design 400 results in mux output (LBL_S2) toggling faster in comparison to the design of FIG. 2.

The pre-charged state of the level-2 bitline (LBL_S2) can also be changed from high (VDD) to low (VSS) as now during a read '0' operation LBL_S2 will toggle from low to high (i.e., pulled up by the PMOS gate) rather than high to low as in the related design of FIG. 2. This allows for a reduction in a number of stages during bitline sensing, which further reduces the access time.

Design 400 also significantly lowers the leakage from the bitcell array. This is because in the non-active phase (i.e., when CLK is low), there will be no VDS available across the bitcells as LBL_S1[7:0] are held pre-charged at VDD. Moreover, CSEL[7:0], which are connected to the bitcell source, are also held at an unselected state (now VDD).

Design 400 also saves upon average dynamic power consumed in a bitcell array. This is because in design 400 only one LBL_S1 (out of 8) will discharge for which the corresponding CSEL has gone low. In the related design of FIG. 2, more than one LBL_S1 might toggle depending upon how many bitcells connected to the asserted RWL are holding a zero value, and this could occur irrespective of which CSEL is asserted.

Returning to FIG. 1, at step 104, one or more of the systems described herein can forward, in response to asserting the column select signal, a bit value stored at that particular column to a gate of a transistor that connects a first stage local bitline to a second stage local bitline. As used herein, the term "bitline" generally refers to an array of memory cells. Moreover, as used herein, the term "forward" generally refers to carrying or transmitting in terms of information, such that a high electrical signal can "forward"

a value of one and a low electrical signal can forward or carry a value of zero, for example.

Returning to FIG. 4, selecting a particular column using the column select signal CSEL can enable a particular value stored in one of the transistors 408 to be forwarded up to the corresponding first stage local bitline (LBL_S1). Moreover, in these examples, the first stage local bitline is connected to the gate of transistor 418, which results in the benefits outlined above.

Furthermore, at step 106, one or more of the systems described herein can forward an inversion of the bit value to the second stage local bitline through a drain of the transistor for local bitline sensing. Thus, after the bit value was forwarded to LBL_S1 at step 104, an inversion of that value can be forwarded from the drain of transistor 408 to output portion 416, where the value can be re-inverted back to its original or accurate state.

In addition to design 400, this application also discloses a methodology for merging pair adjacent level-1 bitlines such that one bitcell can hold two bits at the same time. The choice of bit to be read can depend upon which CSEL of one pair of CSELs is asserted. In a way, this technique effectively compresses data bits along a RWL as each pair of bitcells can be replaced by a single bitcell along the corresponding RWL. Due to the fact that the RWL is a vertical signal, the method can transform an 8×16 (sub-bank) array structure into a 4×16 structure without any loss in information stored. Theoretically, this can also reduce the y-dimension of the corresponding bank, and can ultimately reduce the bank's total area by half.

The methodology can involve running three signals (i.e., a pair of CSELs and a VSS) for every bitcell column. The drain terminal of each bitcell can be connected to a (now merged) bitline, and the gate can be tapped to a corresponding RWL, but the source connection can depend upon the data bit of information to be stored. FIGS. 5-8 show example diagrams corresponding to each permutation.

Figure 5:
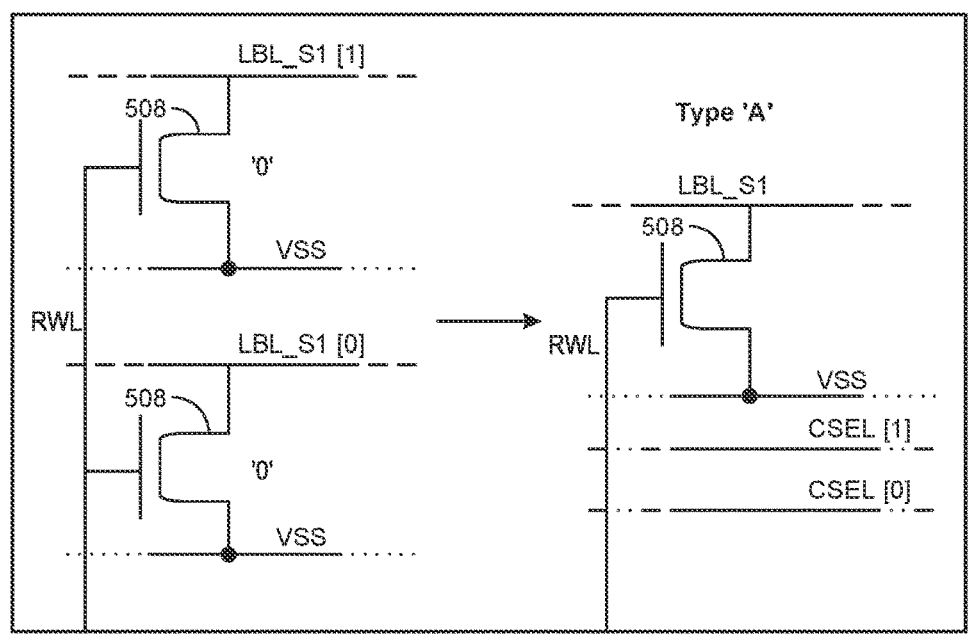
FIG. 5 is a diagram of a type A bitcell.

FIG. 5 shows a diagram 500 for a type "A" bitcell that can be used when a pair of bits along the corresponding RWL holds the value [0, 0] in terms of information stored. This bitcell configuration has its source shorted to VSS, which results in the bitcell discharging LBL (so a '0' is read) when the RWL is asserted, irrespective of which CSEL is selected. In particular, diagram 500 shows the type "A" bitcell on the righthand side, in contrast to the related methodology using two separate instances of a transistor 508 on the lefthand side. Accordingly, on the righthand side of this figure, only a single instance of transistor 508 is being utilized, and its source has been shorted to the VSS signal.

Figure 6:
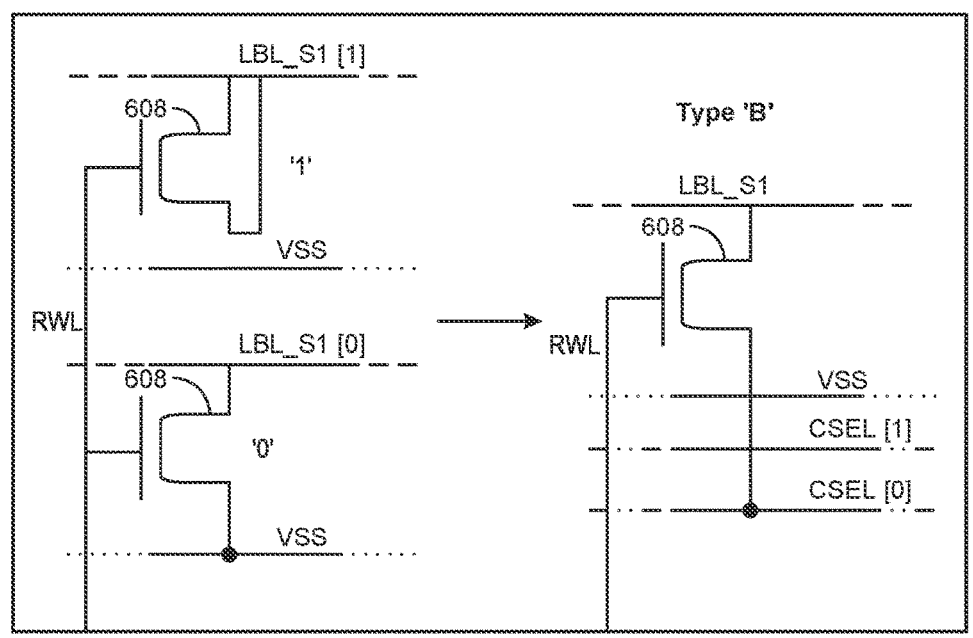
FIG. 6 is a diagram of a type B bitcell.

FIG. 6 shows a diagram 600 for a type "B" bitcell that can be used when a bit pair along a RWL holds the values [1, 0] in terms of information stored. This bitcell configuration has its source shorted to CSEL[0]. It discharges the LBL when the corresponding RWL is asserted and CSEL[0] is selected (i.e., goes low). Moreover, in this example, the LBL is not discharged when CSEL[1] is selected (i.e., a '1' is read). As in FIG. 5, the two instances of transistor 608 on the lefthand side have been effectively replaced by the single instance of transistor 608 on the righthand side, which has its source shorted to CSEL[0].

Figure 7:
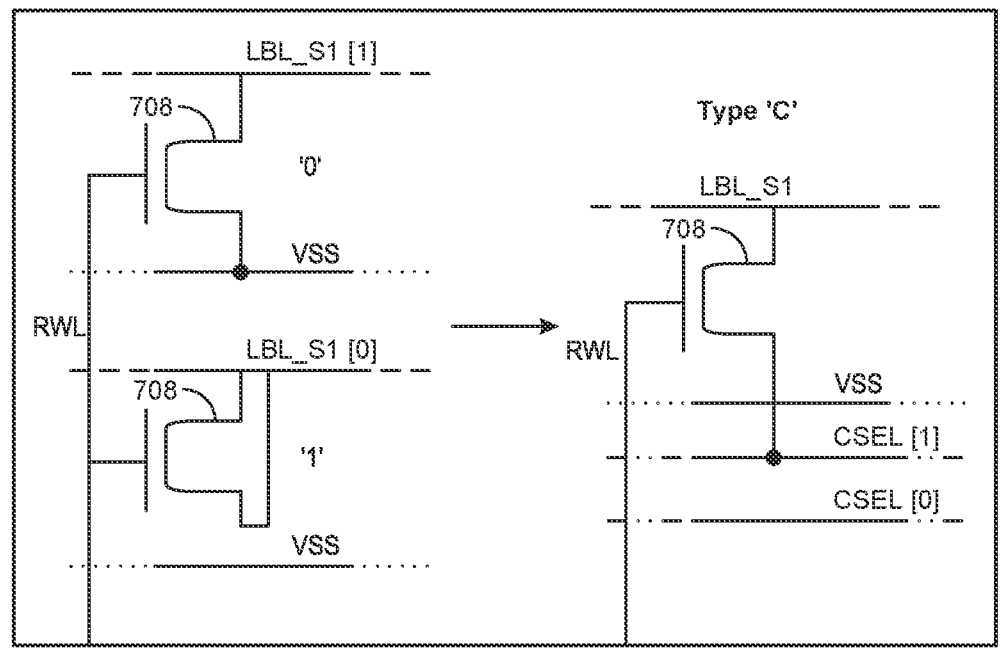
FIG. 7 is a diagram of a type C bitcell.

FIG. 7 shows a diagram 700 for a type "C" bitcell that can be used when storing the values [0, 1] in terms of information stored. This bitcell configuration has its source shorted to CSEL[1]. A '0' value is read when CSEL[1] is selected and a '1' value is read when CSEL[0] is selected. As with FIGS. 5-6, the two instances of a transistor 708 on the lefthand side of FIG. 7 have been effectively replaced by the single instance of transistor 708 on the righthand side.

Figure 8:
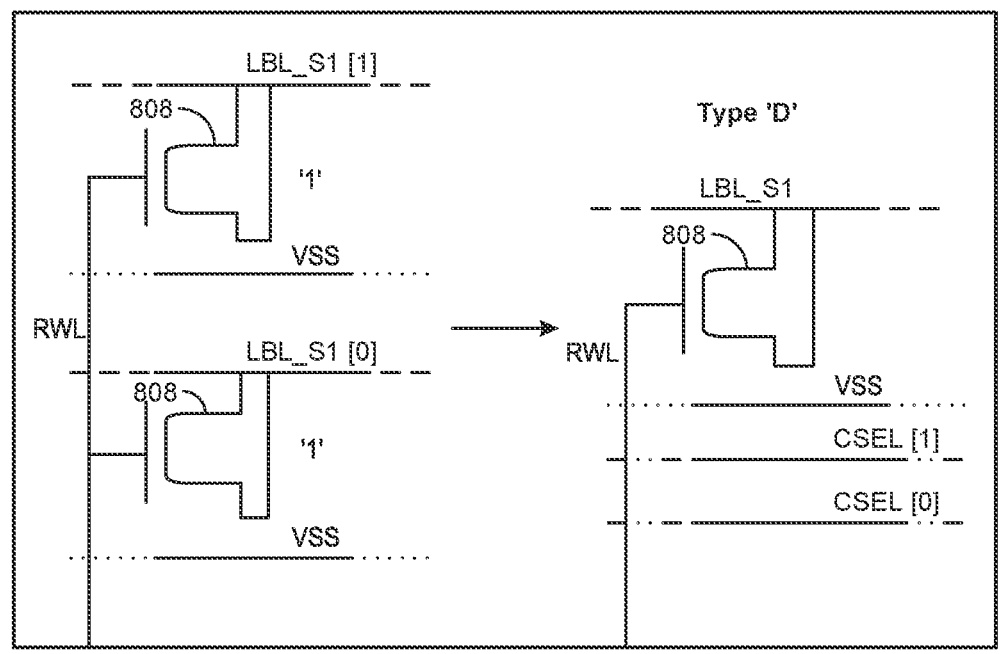
FIG. 8 is a diagram of a type D bitcell.

FIG. 8 shows a diagram 800 for a type "D" bitcell that can be used when storing the values [1, 1] in terms of information stored. As further shown in this figure, the source of the bitcell can be shorted to the LBL, as is the drain. The LBL is not discharged when the corresponding RWL is asserted, regardless of which CSEL is selected. Alternatively, both terminals can also be shorted to VSS, thereby reducing load on the LBL. As with FIGS. 5-7, the two instances of transistor 808 on the lefthand side of FIG. 8 have been effectively replaced by the single instance of transistor 808 on the righthand side.

Figure 9:
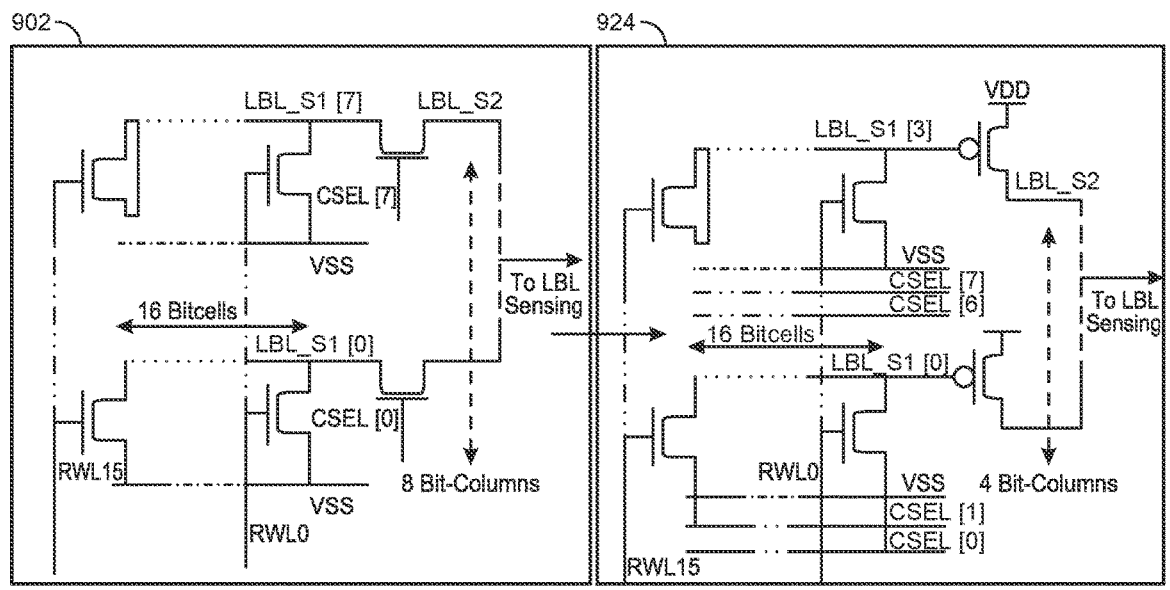
FIG. 9 is a diagram illustrating a sub-bank floorplan transformation.

For completeness, FIG. 9 further shows a diagram 902 and a diagram 924, which help to illustrate a transformation of the corresponding sub-bank floorplan, consistent with FIGS. 2-8. Diagram 902 corresponds to the related methodology of FIG. 2, whereas diagram 924 corresponds to the improved methodology of FIG. 4. With respect to FIGS. 5-8, diagram 924 also further illustrates how the VSS and CSEL signal lines can be configured to create one or more instances of the type A, type B, type C, or type D compressed bitcell that effectively stores two values inside of a single bitcell.

The compression of bitcells can lead to a reduction in the number of bit-columns in a sub-bank from eight to four. Bitlines can be merged and the LBL_S1[7:0] can be converted to a LBL_S1[3:0]. A pair of CSEL signals can run across the bitcells placed on one LBL_S1. As one example, CSEL[1:0] can run for bitcells on LBL_S1[0], CSEL[3:2] for LBL_S1[1], CSEL[5:4] for LBL_S1[2], and CSEL[7:6] for LBL_S1[3]. In this manner, connections can be formed from pre-existing signals in the bank and no extra signals are further involved or required.

Figure 10:
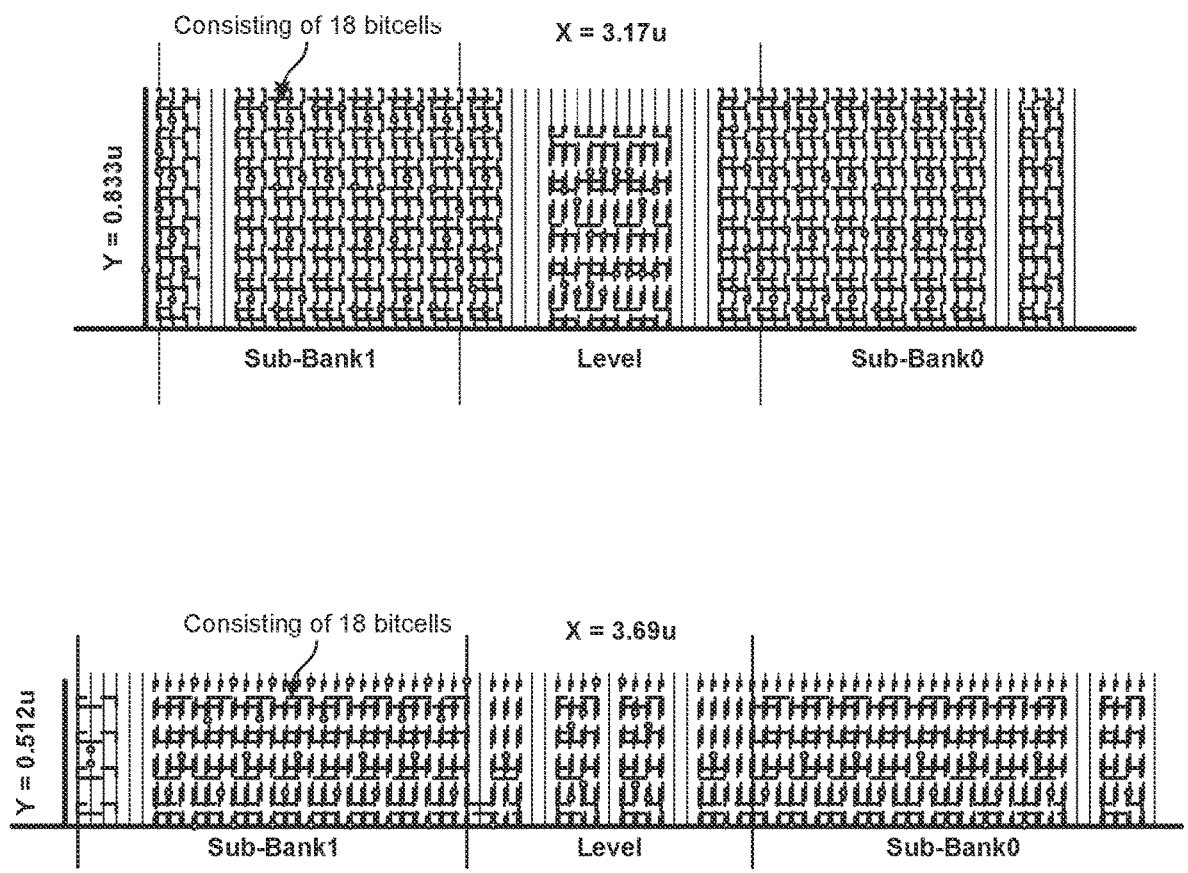
FIG. 10 is a diagram of a comparison between two floorplans.
Figure 11:
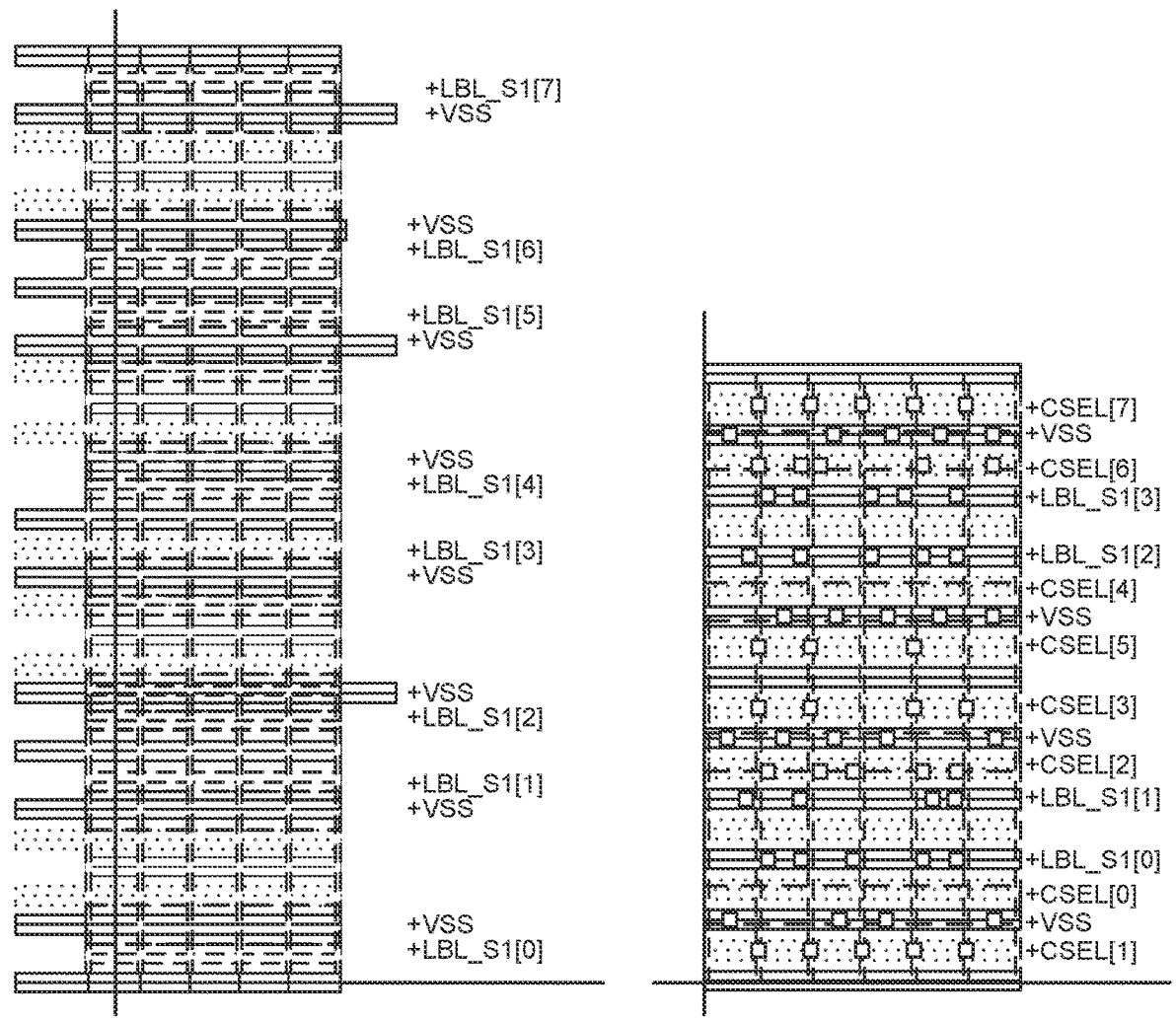
FIG. 11 is a diagram of an example track planning comparison.
Figure 12:
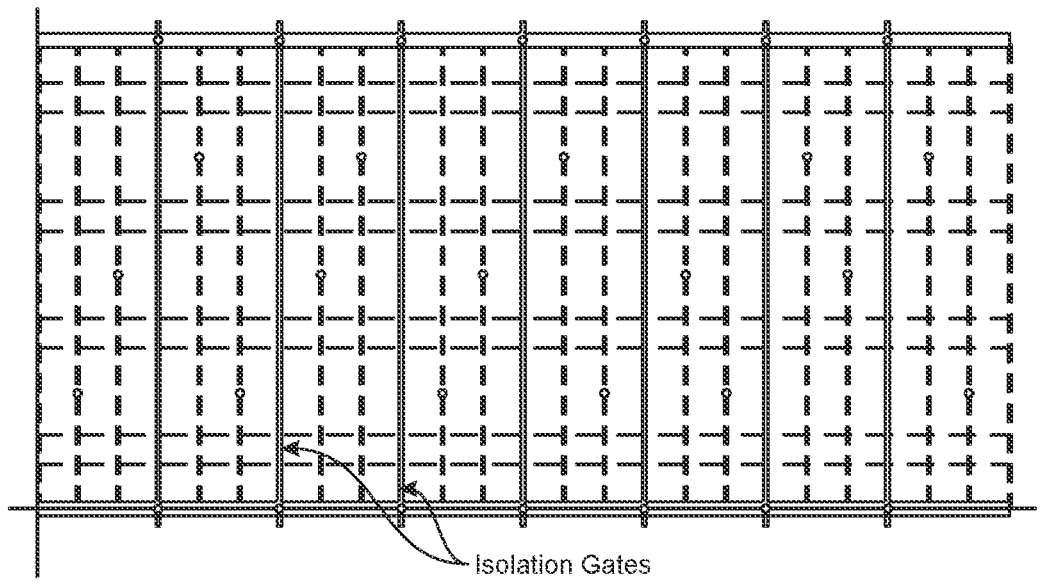
FIG. 12 is a diagram of an example gate placement.

FIGS. 10-12 generally show results corresponding to comparison data that was generated by performing measurements over an actual design rule checking (DRC) clean layout. In these examples, VDD can be set equal to 0.9 volts. With respect to FIGS. 10-11, the data compression technique outlined above effectively squeezed the same amount of information into exactly half the number of bitcells, as shown by comparison with the related technique (FIG. 10 top and FIG. 11 leftside) with the improved technique (FIG. 10 bottom and FIG. 11 rightside). In this example, space that was used to run additional tracks to route three signals (i.e., including CSEL[1:0] and VSS rather than only VSS, as in the related methodology of FIG. 2) was utilized from free tracks that were available in the related design and tracks left out of routing four less LBLs. Nevertheless, as further shown in these figures, via enclosure and cut-poly DRC features resulted in less than 50% gain along the y-dimension.

Also, to address the fact that the source terminals of adjacent bitcells are now being shorted to different signals (depending upon programming), an isolation ("PODE") gate has been added for every pair of bitcells over an LBL. FIG. 12 shows the insertion of isolation (e.g., "PODE") gates. This resulted in an increase along the x-dimension of a sub-bank. But the stage reduction and better device sharing in the local evaluation section (i.e., bitline sensing block) could save upon additional space along the x-dimension.

Even after all of the compensations outlined above, the methodology of FIGS. 4-9 reduced area by 28% at the bank (×32) level and the bit-slice level (5 such banks abutted sideways). Due to the fact that the bitcell array contributes around 52% to the total macro area, the overall gain in area at the macro level is 15%. In the following diagram, all dimensions are in terms of microns.

|  | Bit-slice (related art) | Bit-slice (Improved) | % Increase |
|---|---|---|---|
| X | 15.7745 | 18.406 | 17% |
| Y | 0.8335 | 0.512 | −39% |
| Area | 13.148 | 9.424 | −28% |

Regarding timing, for this analysis (i.e., involving an operation to read a value of zero) of the new design, the CSEL signal can be configured to be settled at the select state (i.e., VSS) before the RWL arrives at the bitcell gate. This ensures that a full VDS is developed across the bitcell before it starts discharging the LBL. This can be achieved in various different ways, including for example providing a faster clock to a corresponding CSEL decoder in the control block. At the bit-slice level the access-time (i.e., from RWL rising at the bitcell gate to the final super-bitline falling) improves by 10%. In the following diagram, corresponding values are in terms of picoseconds.

|  | Bit-slice (related art) | Bit-slice (improved) | % Increase |
|---|---|---|---|
| Access Time | 38.1 | 34.37 | −10% |

During a read operation to read a value of '1', both LBL_S1 and LBL_S2 float. The float-time analysis checks if the given bitline falls below (in the related design) or rises above (in the improved methodology of FIG. 9) 5% of its pre-charged level (i.e., VDD in the case of the related design, VSS in the case of the improved design of FIG. 9) due to leakage. Analysis shows that LBL_S2 in the improved design suffers lesser leakage than in the related design. A major reason for this is due to the substantial decoupling of LBL_S1 and S2 in the improved design of FIG. 9, such that bitcell leakage might no longer impact the level of LBL_S2.

Regarding leakage, in the related design, array leakage was a total of the leakage current of all bitcells storing a '0' (i.e., where the source was connected to VSS). In the improved design of FIG. 9, only bitcell type "A" will contribute toward the array leakage. As the number of type "A" bitcells will always be quite small compared to the bitcells storing a zero in the related design, the array leakage is seen to improve considerably. At the sub-bank level (×16 array) the leakage improves significantly by 75%.

|  | Sub-bank (related art) | Sub-bank (improved) | % Increase |
|---|---|---|---|
| I_leak | 8.19E−07 | 2.05E−07 | −75% |
| Power | 7.37E−07 | 1.84E−07 | −75% |

To make improvements with respect to access time, a few devices in the local sensing block can be switched to a lower voltage type (i.e., faster but also leakier). This potential conversion can impede the gain in overall leakage but at the bit-slice level the gain in leakage is still significant at 27%.

|  | Bit-slice (related art) | Bit-slice (improved) | % Increase |
|---|---|---|---|
| I_leak | 1.14E−05 | 8.36E−06 | −27% |
| Power | 1.03E−05 | 7.53E−06 | −27% |

At the macro level, leakage can be expected to be reduced by 21%, for example.

In terms of dynamic power, this can be a direct function of active capacitance (Cac). At the sub-bank level, the activity factor on level-1 LBL reduces by 75% in the design of FIG. 9. The increase in route-length of LBL_S1 in the methodology can increase in the x-dimension, which can increase the active capacitance of the LBL but the total power can still improve by 68%.

|  | Sub-bank (related art) | Sub-bank (improved) | % Increase |
|---|---|---|---|
| Cac | 1.19E−15 | 1.52E−15 | 27% |
| Cac_Tot | 4.77E−15 | 1.52E−15 | −68% |

At the bit-slice level, the increased route-lengths and tapping of column-select signals generally increase the capacitive load over these nodes resulting in an increase in power consumed in the bitline-sensing block. But overall dynamic power consumption can still improve by 7%. Optimization of signal routings can further lead to incremental improvement in dynamic power gain.

|  | Bit-slice (related art) | Bit-slice (Improved) | % Increase |
|---|---|---|---|
| I_avg | 4.40E−04 | 4.09E−04 | −7% |
| P_avg | 3.96E−04 | 3.68E−04 | −7% |

In summary, it is evident that a new array design (see FIG. 9 for example), which involves a new column-mux select technique (see FIG. 4) and a new data-compression technique (see FIGS. 5-8), can result in a significant area improvement at the macro level. Moreover, this new design does not follow the general trade-off rule where one parameter improves at the expense of others. In addition to improvements in area, the new design also gains significantly in terms of leakage and (also) marginally in terms of access-time and dynamic power, as further discussed above.

While the foregoing disclosure sets forth various embodiments using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various embodiments have been described and/or illustrated herein in the context of fully functional computing systems, one or more of these example embodiments can be distributed as a program product in a variety of forms, regardless of the particular type of computer-readable media used to actually carry out the distribution. The embodiments disclosed herein can also be implemented using modules that perform certain tasks. These modules can include script, batch, or other executable files that can be stored on a computer-readable storage medium or in a computing system. In some embodiments, these modules can configure a computing system to perform one or more of the example embodiments disclosed herein.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
   asserting a read wordline signal to a desired wordline of a column mux read-only memory, wherein a single bitcell corresponding to the wordline is associated with at least two separate column select signal lines;
   asserting a single column select signal to a desired one of the at least two separate column select signal lines to select a particular bitcell from the desired wordline;
   forwarding, in response to asserting the column select signal, a bit value stored at that particular bitcell to a gate of a transistor that connects a first stage local bitline to a second stage local bitline; and
   forwarding an inversion of the bit value to the second stage local bitline through a drain of the transistor for local bitline sensing.

2. The method of claim 1, wherein the column mux read-only memory stores instructions for an instance of the Basic Input/Output System.

3. The method of claim 1, wherein the transistor comprises a P-channel metal-oxide-semiconductor transistor.

4. The method of claim 1, wherein the bitcell corresponds to a transistor coupled to the first stage local bitline.

5. The method of claim 1, wherein the column mux read-only memory comprises a sub-bank.

6. The method of claim 5, wherein a local evaluation section is disposed between two instances of the sub-bank.

7. The method of claim 1, wherein the first stage local bitline and the second stage local bitline are substantially decoupled.

8. The method of claim 1, wherein the first stage local bitline stores a one by connecting a drain of a second transistor to a source of the second transistor.

9. The method of claim 1, wherein the first stage local bitline stores a zero by connecting a drain of a second transistor to a line for the column select signal.

10. The method of claim 1, wherein the bitcell effectively stores two separate bit values.

11. A column mux read-only memory comprising:
    a wordline corresponding to one or more bitcells;
    a plurality of column select signal lines to select a particular column within the column mux read-only memory, wherein a single bitcell of the wordline is associated with at least two separate column select signal lines of the plurality of column select signal lines;
    a first stage local bitline that reads a bit value at a particular bitcell and that is connected to a gate of a transistor; and
    a second stage local bitline that is connected to a drain of the transistor and that forwards an inversion of the bit value.

12. The column mux read-only memory of claim 11, wherein the mux read-only memory stores instructions for an instance of the Basic Input/Output System.

13. The column mux read-only memory of claim 11, wherein the transistor comprises a P-channel metal-oxide-semiconductor transistor.

14. The column mux read-only memory of claim 11, wherein the bitcell corresponds to a transistor coupled to the first stage local bitline.

15. The column mux read-only memory of claim 11, wherein the column mux read-only memory comprises a sub-bank.

16. The column mux read-only memory of claim 15, wherein a local evaluation section is disposed between two instances of the sub-bank.

17. The column mux read-only memory of claim 11, wherein the first stage local bitline and the second stage local bitline are substantially decoupled.

18. The column mux read-only memory of claim 11, wherein the first stage local bitline stores a one by connecting a drain of a second transistor to a source of the second transistor.

19. The column mux read-only memory of claim 11, wherein the first stage local bitline stores a zero by connecting a drain of a second transistor to a line for the column select signal.

20. A method comprising:
    connecting a read wordline signal line to a wordline of a column mux read-only memory, wherein a single bitcell corresponding to the wordline is associated with at least two separate column select signal lines;
    connecting a first stage local bitline to one or more bitcells of the wordline in order to select a particular bitcell from the wordline;
    connecting the first stage local bitline to a gate of a transistor; and
    connecting a second stage local bitline to a drain of the transistor such that the drain of the transistor is configured to forward an inversion of a bit value stored in the column mux read-only memory.

\* \* \* \* \*